US011632101B1

(12) United States Patent
Beccue

(10) Patent No.: US 11,632,101 B1
(45) Date of Patent: Apr. 18, 2023

(54) VOLTAGE LEVEL SHIFTER APPLICABLE TO VERY-LOW VOLTAGES

(71) Applicant: Bitmain Development Inc., Dover, DE (US)

(72) Inventor: Stephen M. Beccue, Frazier Park, CA (US)

(73) Assignee: Bitmain Development Inc., Dover, DE (US)

(*) Notice: Subject to any disclaimer, the term of this patent is extended or adjusted under 35 U.S.C. 154(b) by 0 days.

(21) Appl. No.: 17/491,052

(22) Filed: Sep. 30, 2021

(51) Int. Cl.
*H03K 19/00* (2006.01)
*H03K 19/003* (2006.01)
*H03K 19/0175* (2006.01)
*H03K 19/0185* (2006.01)
*H03K 3/356* (2006.01)

(52) U.S. Cl.
CPC . *H03K 3/356113* (2013.01); *H03K 3/356182* (2013.01); *H03K 19/018521* (2013.01)

(58) Field of Classification Search
None
See application file for complete search history.

(56) References Cited

U.S. PATENT DOCUMENTS

| 7,880,501 | B2* | 2/2011 | Han | H03K 3/356113 326/68 |
| 7,952,415 | B2* | 5/2011 | Shim | H03K 19/018521 327/333 |
| 8,618,861 | B2* | 12/2013 | Chen | H03K 3/356165 327/333 |
| 9,136,846 | B2* | 9/2015 | Henmi | H03K 3/356182 |
| 9,209,812 | B2* | 12/2015 | Kim | G09G 3/3696 |
| 10,187,061 | B1* | 1/2019 | Venugopal | H03K 19/0013 |
| 10,530,365 | B1* | 1/2020 | Ribeiro do Nascimento | H03K 3/35613 |
| 10,911,047 | B1* | 2/2021 | Shetty | H03K 19/0016 |
| 2010/0118022 | A1* | 5/2010 | Kim | H03K 3/356113 327/333 |
| 2017/0154568 | A1* | 6/2017 | Tsuchi | G09G 3/2092 |

* cited by examiner

Primary Examiner — Kenneth B Wells
(74) Attorney, Agent, or Firm — Jon E. Gordon; Haug Partners LLP

(57) ABSTRACT

Some embodiments provide a voltage-level shifter circuit comprising a cross-coupled transistor pull-up network that includes a plurality of diode-connected transistors configured to cause the state of the cross-coupled transistor network to switch at a low current through a pull-down network coupled thereto, such as a current corresponding to near-threshold voltage or sub-threshold voltage operation of the pull-down network.

13 Claims, 9 Drawing Sheets

VOLTAGE LEVEL SHIFTER APPLICABLE TO VERY-LOW VOLTAGES

BACKGROUND

The present disclosure relates to integrated circuits, and more particularly to integrated circuit voltage level shifting, some embodiments of which are particularly well-suited for very low or ultra-low voltage levels, such as sub-threshold and near-threshold voltages.

Multi-Supply Voltage (MSV) design techniques are used in integrated circuits (ICs), such as an ASIC (Application Specific IC), a SoC (System-on-Chip) or general purpose processor, to facilitate providing high performance and low power dissipation in view of different blocks of circuitry within the IC having different target performance, objectives, and constraints. For instance, in some technology nodes, high-speed core logic transistors may require a lower supply voltage than peripheral input-output (I/O) transistors. And even within core logic, some circuit blocks (e.g., along critical paths) may require a higher supply voltage to minimize propagation delay, whereas other core circuit blocks (e.g., along non-critical paths) may tolerate increased delay and thus may be operated at lower voltage levels to reduce power consumption.

Signal transfer between regions operating at different supply voltage levels requires voltage level conversion circuits, also referred to as level shifters. Converting from low supply voltage regions to high supply voltage regions (so-called Low-to-High level conversion) is generally more problematic and critical, particularly as the low supply voltage decreases to low voltages (e.g., to near-threshold or sub-threshold) at least because under-driven level-shifter circuitry (e.g., pull-down transistors) will exhibit degraded rise and fall times, which may result in increased switching current over an extended transition time, thus corresponding to increased power dissipation.

FIG. 1 illustrates a known low-to-high level shifter (or level-up converter) that employs a cross-coupled pair of PMOS pull-up transistors M2 and M3 and pull-down NMOS transistors M0 and M1 to convert a signal received at $V_{IN}$ from low supply voltage ($V_{DDL}$) circuitry to a signal provided at $V_{OUT}$ to high supply voltage ($V_{DDH}$) circuitry. Assuming positive logic, if M0 is off ($V_{IN}$=0 V), M1 is on, node N1 is at 0 V (low), so M2 is on, node N0 is at $V_{DDH}$ (hi), and M3 is off. As M0 turns on from low ($V_{IN}$=0 V) to hi ($V_{IN}$=$V_{DDL}$), M0 pulls down node N0, causing M3 to turn on. As M3 turns on and M1 turns off, node N1 is pulled-up (charged) to $V_{DDH}$, turning M2 off. Note, however, that before M2 is turned off in this manner, both M0 and M2 are concurrently conducting as M0 turns on, so that there is current contention between pull-up and pull-down. Thus, to pull down node N0 and trigger the positive feedback that causes the toggling of the state of the cross-coupled pair, the pull down current of M0 must be greater than the pull up current of M2, and should be sufficiently greater than the pull up current for reducing switching time and dynamic power consumption. While the pull-down strength relative to the pull-up strength may be increased by increasing the size (width) of the pull down transistors relative to the pull-up transistor size, such oversizing of the pull-down transistors would occupy a large chip area and may become an infeasible solution for overcoming the pull-up current as the low-supply voltage ($V_{DDL}$) further decreases (e.g., to near/above-threshold or to sub-threshold).

Accordingly, there remains a need for improved integrated circuit voltage level shifters, and particularly for a low-to-high voltage level shifter that is capable of shifting very low voltages, such as sub-threshold and/or near-threshold voltage levels, with very low power dissipation and delay, while preferably occupying a small chip area and/or not requiring transistor oversizing.

SUMMARY OF SOME ILLUSTRATIVE EMBODIMENTS

The present disclosure describes various illustrative embodiments of a voltage level shifter that comprises a cross-coupled latch network that includes diode devices, such as diode-connected field-effect transistors, configured to cause the cross-coupled latch network to switch between bistable states at low currents, such as at sub-threshold or near-threshold currents.

For instance, some embodiments provide a voltage-level shifter circuit comprising a cross-coupled transistor pull-up network that includes a plurality of diode-connected transistors configured to cause the state of the cross-coupled transistor network to switch at a low current through a pull-down network coupled thereto, such as a current corresponding to near-threshold voltage or sub threshold voltage operation of the pull down network. The cross-coupled transistor pull-up network may comprise a pair of PMOS transistors having respective source terminals coupled to a first supply conductor that is configured to be electrically connected to a first supply voltage, and the plurality of diode-connected transistors may comprise either diode-connected PMOS transistors or diode-connected NMOS transistors that are respectively coupled in series with the pair of PMOS transistors. The pull-down network may comprise a pair of NMOS transistors respectively coupled in series with diode-connected transistors.

In some embodiments, a voltage level shifter circuit comprises a cross-coupled transistor network, a first input field-effect transistor (FET), a second input FET, and an output buffer transistor circuit. The cross-coupled transistor network includes (i) a first FET of a first conductivity type having a source coupled to a first supply conductor that is configured to be electrically connected to a first supply voltage, (ii) a first diode-connected FET of the first conductivity type having a source coupled to a drain of the first FET, (iii) a second FET of a first conductivity type having a source coupled to the first supply conductor and having a gate coupled to the gate and drain of the first diode connected FET, and (iv) a second diode-connected FET of the first conductivity type having a source coupled to a drain of the second FET and having a gate and a drain coupled to a gate of the first FET. The first input FET is of a second conductivity type opposite to the first conductivity type and has (i) a source coupled to a second supply conductor that is configured to be electrically connected to a second supply voltage, (ii) a drain coupled to the drain of the first diode connected FET, and (iii) a gate configured to receive an input logic signal having an input voltage swing that ranges from the second supply voltage to a third supply voltage that is between the second supply voltage and the first supply voltage. The second input FET is of the second conductivity type and has (i) a source coupled to the second supply conductor, (ii) a drain coupled to the drain of the second diode connected FET, and (iii) a gate configured to receive a second input logic signal having said input voltage swing and being complementary to the first input logic signal. And the output buffer transistor circuit comprises at least one FET of the first conductivity type and at least one FET of the second conductivity type, wherein the output buffer transistor circuit is (i) coupled to the first supply conductor, to the second supply conductor, and to at least one node of the cross-coupled transistor network, and (ii) configured to provide an output logic signal corresponding to the input logic signal and having an output voltage swing that ranges from the second supply voltage to the first supply voltage.

In some embodiments, the cross-coupled transistor network may include no more than four transistors consisting of the first and second FETs and the first and second diode-connected FETs, and the cross-coupled transistor network is not directly coupled to any additional transistors except for the first and second input FETs and one or more transistors of the output buffer transistor circuit. Additionally, in some embodiments, each of the first and second input FETs is not directly coupled to any additional transistors except for (i) the drains of the first and second input FETs being directly coupled respectively to the first and second diode-connected FETS, and (ii) the gates of the first and second input FETs being directly coupled to one or more transistors of an inverter that is coupled to the second supply conductor and to a third supply conductor that is configured to be electrically connected to the third supply voltage, such that the first input logic signal is one of an input signal and an output signal of the inverter and the second input logic signal is the other of the input signal and the output signal of the inverter.

In some embodiments, the output buffer circuit comprises a split-input inverter and/or a single-input output inverter. The split-input inverter may comprise (i) a first output buffer FET of the first conductivity type having a source coupled to the first supply conductor, a gate coupled to a first node of the cross-coupled transistor network, and (ii) a second output buffer FET of the second conductivity type having a drain coupled to the drain of the first output buffer FET, a source coupled to the second supply conductor, and a gate coupled to a second node of the cross-coupled transistor network.

In some embodiments, the single-input output inverter may comprise (i) a third output buffer FET of the first conductivity type having a source coupled to the first supply conductor, a gate coupled to the drain of the second output buffer FET, and a drain, (ii) a fourth output buffer FET of the second conductivity type having a drain coupled to the drain of the first output buffer FET, a source coupled to the second supply conductor, and a gate coupled to the gate of the of the third output buffer FET, and (iii) a node, coupled to the drains of the third and fourth output buffer FETs, at which the output logic signal is provided.

In some embodiments, the single-input output inverter may comprise (i) a third output buffer FET of the first conductivity type having a source coupled to the first supply conductor, a gate coupled to either the drain of first FET or the drain of the first input FET, and a drain, (ii) a fourth output buffer FET of the second conductivity type having a drain coupled to the drain of the third output buffer FET, a source coupled to the second supply conductor, and a gate coupled to the gate of the of the third output buffer FET, and (iii) a node, coupled to the drains of the third and fourth output buffer FETs, at which the output logic signal is provided.

In some embodiments, each of the FETs of the voltage level shifter circuit, including the first and second FETS, the first and second diode-connected FETs, and each transistor of the output buffer transistor circuit, are core transistors.

In some embodiments, the first conductivity type is p-type and the second conductivity type is n-type, the first and second FETs and the first and second diode-connected FETs are p-channel insulated gate FETs, and the first and second input FETS are n channel insulated gate FETs. In some embodiments, the first conductivity type is n-type and the second conductivity type is p-type, the first and second FETs and the first and second diode-connected FETs are n-channel insulated gate FETs, and the first and second input FETS are p-channel insulated gate FETs.

In some embodiments, a voltage level shifter circuit comprises a cross-coupled transistor network, a first input field-effect transistor (FET), a second input FET, and an output buffer transistor circuit. The cross-coupled transistor network includes (i) a first FET of a first conductivity type having a source coupled to a first supply conductor that is configured to be electrically connected to a first supply voltage, (ii) a first diode-connected FET coupled to in series with the first FET, (iii) a second FET of a first conductivity type having a source coupled to the first supply conductor and having a gate coupled to the gate of the first diode-connected FET, and (iv) a second diode-connected FET coupled in series with the second FET and having a gate coupled to a gate of the first FET. The first input FET is of a second conductivity type opposite to the first conductivity type and has (i) a source coupled to a second supply conductor that is configured to be electrically connected to a second supply voltage, (ii) a drain coupled to the first diode-connected FET, and (iii) a gate configured to receive an input logic signal having an input voltage swing that ranges from the second supply voltage to a third supply voltage that is between the second supply voltage and the first supply voltage. The second input FET is of the second conductivity type and has (i) a source coupled to the second supply conductor, (ii) a drain coupled to the second diode-connected FET, and (iii) a gate configured to receive a second input logic signal having said input voltage swing and being complementary to the first input logic signal. And the output buffer transistor circuit comprises at least one FET of the first conductivity type and at least one FET of the second conductivity type, wherein the output buffer transistor circuit is (i) coupled to the first supply conductor, to the second supply conductor, and to at least one node of the cross-coupled transistor network, and (ii) configured to provide an output logic signal corresponding to the input logic signal and having an output voltage swing that ranges from the second supply voltage to the first supply voltage. In some embodiments, the first and second diode-connected FETs are of the first conductivity type. In some embodiments, the first and second diode-connected FETs are of the second conductivity type.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of some embodiments of the invention, both as to structure and operation, will be understood and will become more readily apparent in view of the following description of non-limiting and non-exclusive embodiments in conjunction with the accompanying drawings, in which like reference numerals designate the same or similar parts throughout the various figures, and wherein.

DETAILED DESCRIPTION OF SOME ILLUSTRATIVE EMBODIMENTS

Figure 1:
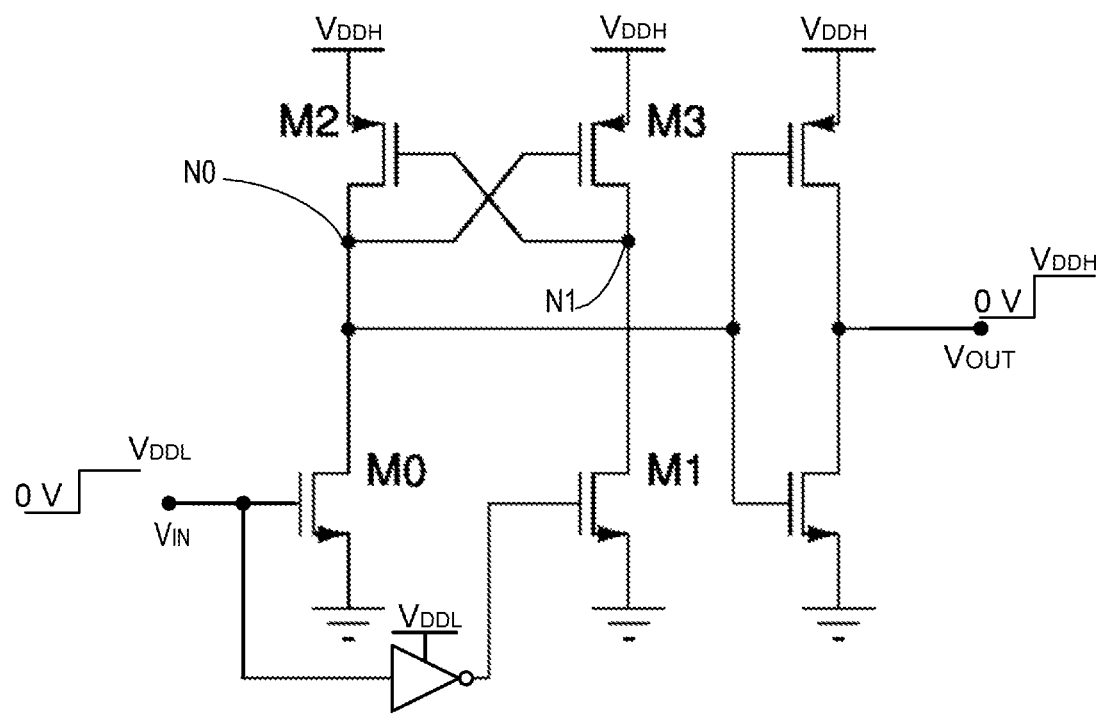
FIG. 1 schematically depicts a known level-up shifter.

Throughout the description and claims, the following terms take at least the meanings explicitly associated herein, unless the context dictates otherwise. The meanings identified below do not necessarily limit the terms, but merely provide illustrative examples for the terms.

The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

In addition, as used herein, unless the context clearly dictates otherwise, the term "coupled" refers to directly connected or to indirectly connected through one or more intermediate components and, in some contexts, may also denote or include electrically coupled, such as conductively coupled, capacitively coupled, and/or inductively coupled. Further, "conductively coupled (connected)," "electrically coupled (connected)," and "galvanically coupled (connected)," and similar variants, each refer to being coupled (connected) via one or more intermediate components that permit energy transfer via conduction current, which is capable of including direct current as well as alternating current, while "capacitively coupled" refers to being electrostatically coupled through one or more dielectric media, and possibly also via one or more intervening conductors (e.g., via a series of capacitive components), that permit energy transfer via displacement current and not via direct current between the coupled (connected) components. Those skilled in the art will further understand that elements may be capacitively coupled intentionally or unintentionally (e.g., parasitically) and that in some contexts, elements said to be capacitively coupled may refer to intentional capacitive coupling. In addition, those skilled in the art will also understand that in some contexts the term "coupled" may refer to operative coupling, through direct and/or indirect connection. For instance, a conductor (e.g., control line) said to be coupled to the gate of a transistor may refer to the conductor being operable to control the gate potential so as to control the operation of the transistor (e.g., switching the transistor between "on" and "off" states), regardless of whether the conductor is connected to the gate indirectly (e.g., via another transistor, etc.) and/or directly.

For clarity, it is noted that the term MOS (metal-oxide-semiconductor), including its use in connection with PMOS (p-channel MOS), NMOS (n-channel MOS), and CMOS (complementary metal-oxide-semiconductor), as understood by those skilled in the art and as used herein, is not limited to technologies requiring a metal-oxide gate stack but may include, for example, gate conductors that comprise polysilicon or other non-metal materials (and that, in some implementations, may not include a metal) and/or gate dielectrics that comprise non-oxide materials (and that, in some implementations, may not include an oxide). As such, a MOSFET (MOS field effect transistor), whether a PMOS transistor or an NMOS transistor, more generally refers to an insulating gate field effect transistor, where the gate insulator may or may not comprise an oxide (e.g., silicon dioxide and/or hafnium oxide). Also for clarity, it is noted that the terms PMOS transistor, PMOS FET, p-type FET, p-channel FET, and p-type insulating gate FET, or similar variations, are used herein interchangeably, and, likewise, the terms NMOS transistor, NMOS FET, n-type FET, n-channel FET, and n-type insulating gate FET, or similar variations, are used herein interchangeably.

Figure 2:
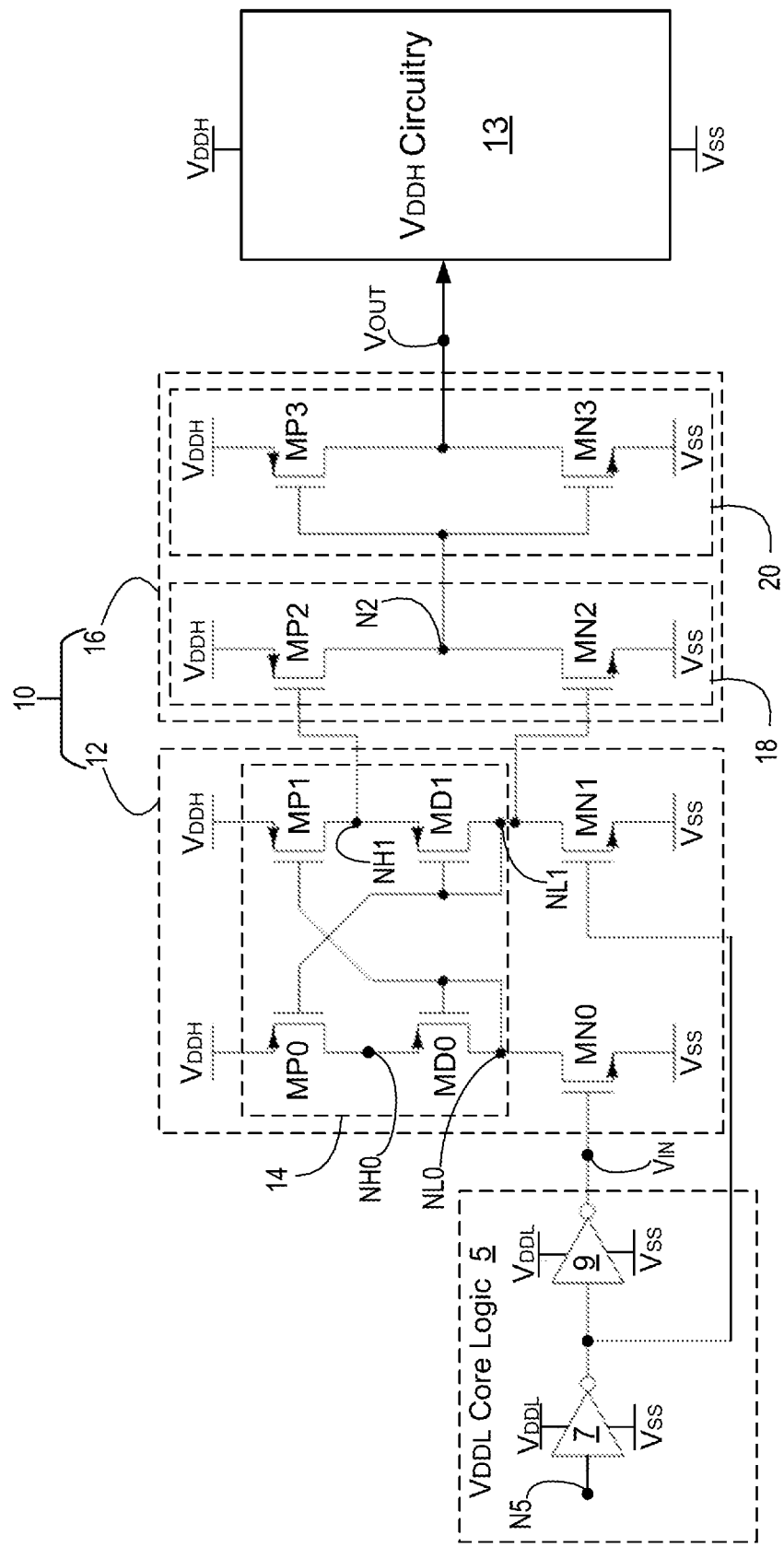
FIG. 2 schematically depicts an illustrative voltage-level shifter circuit, in accordance with some embodiments.

FIG. 2 schematically depicts an illustrative voltage-level shifter circuit 10 in accordance with some embodiments according to the present disclosure. As shown, voltage-level shifter circuit 10 comprises a primary voltage-level shifter 12 coupled to an output buffer 16, with primary voltage-level shifter 12 having an input node $V_{IN}$, output buffer 16 having an output node $V_{OUT}$, and both primary voltage-level shifter 12 and output buffer 16 being supplied by a first supply voltage $V_{DDH}$ and a second supply voltage $V_{SS}$, where $V_{DDH}$ is greater than $V_{SS}$.

As shown, voltage-level shifter circuit 10 according to the illustrative embodiment of FIG. 2 has its input node $V_{IN}$ coupled to $V_{DDL}$ core logic circuitry 5 and its output node $V_{OUT}$ coupled to $V_{DDH}$ circuitry 13. $V_{DDH}$ circuitry 13 is supplied at the same voltage levels as voltage-level shifter circuit 10 and output buffer 16; namely, $V_{DDH}$ and $V_{SS}$. $V_{DDL}$ core logic circuitry 5 is supplied by the second supply voltage $V_{SS}$ and by a third supply voltage $V_{DDL}$, wherein voltage $V_{DDH}$ is greater than voltage $V_{DDL}$, which is greater than voltage $V_{SS}$ (i.e., $V_{DDH} > V_{DDL} > V_{SS}$).

Briefly, as further described hereinbelow following a further description of the circuit components and topology, in operation voltage level shifter circuit 10 (i) receives at input node $V_{IN}$ from $V_{DDL}$ core logic circuitry 5 an input logic signal having a voltage swing between voltage $V_{SS}$ and voltage $V_{DDL}$ and (ii) outputs at output node $V_{OUT}$ an output logic signal logically equivalent to the input logic signal and having a voltage swing between voltage $V_{SS}$ and voltage $V_{DDH}$, wherein (as described) $V_{DDH}$ is greater than $V_{DDL}$ which is greater than $V_{SS}$. More specifically, the logic level (e.g., "High" or logic 1, assuming positive logic) represented by voltage $V_{DDL}$ for the input logic signal is represented by voltage $V_{DDH}$ for the output logic signal, while the logic level represented by voltage $V_{SS}$ (e.g., "Low" or logic 0, assuming positive logic) is also represented by voltage $V_{SS}$ for the output logic signal.

As will be understood, voltage $V_{SS}$ is a common reference potential with respect to voltage-level shifter circuit 10, $V_{DDL}$ core logic circuitry 5, and $V_{DDH}$ circuitry 13, and may be considered as being ground potential (i.e., $V_{SS}=0$ V) for such an associated on-chip circuitry referenced to the same $V_{SS}$ rail voltage. In some embodiments, a system may comprise such an associated on-chip circuitry referenced to the same $V_{SS}$ rail as a circuit sub-system together with additional circuit sub-systems or modules (whether on the same chip, on different chips, and/or on different printed circuit boards, etc.) that, for example, may be supplied in series by a main power supply, so that different subsystems each may have respective rail voltages (e.g., $V_{DDH}$, $V_{DDL}$, $V_{SS}$) at different voltages relative to the overall system ground.

$V_{DDL}$ core logic circuitry 5 may comprise high-speed digital circuitry implemented using core transistors for the given process or technology node used to fabricate an integrated circuit comprising the circuitry schematically depicted in the illustrative embodiment of FIG. 2.

For instance, as will be understood by those skilled in the art, foundry processes and technology nodes generally or typically specify core transistors and input/output (I/O) transistors. Such core transistors generally correspond to and are based on the minimum dimension (e.g., minimum gate length), highest speed transistors that may be fabricated using that technology node (e.g., in accordance with its specification and design rules, etc.), and thus are provided for implementing the high-density, high-speed logic circuitry of a given monolithic integrated circuit (e.g., "IC," "chip," or "die"). For clarity, as also understood by those skilled in the art, it is noted that core transistors employed within core circuitry are not necessarily all configured as minimum gate length devices (nor, e.g., as minimum gate width devices). The scale of the core transistors typically requires operation at lower voltage compared to, for example, I/O transistors. In this regard, operating core transistors above their nominal operating voltage range, such as at a higher I/O voltage range, generally not only degrades their performance (e.g., increased leakage current) while operating at that higher voltage, but also may degrade or damage the devices themselves, and may result in device failure (e.g., such as due to punch-through, avalanche breakdown, or gate dielectric breakdown, etc.), including possibly catastrophic (irreversible) failure.

In contrast, the I/O transistors of a given technology node are provided for interfacing core circuitry with external (e.g., off-chip) circuits or components having generally high capacitance and typically operating at higher voltages than the core circuitry, thus requiring the I/O transistors and associated I/O circuitry to have higher current carrying and drive capacity and higher operating voltage than the core transistors. As used herein, the term I/O generally refers to such higher current-drive transistors and/or circuitry, unless the context clearly dictates otherwise. For instance, it is noted that some types of core circuitry may include certain input/output circuitry, such as high-speed memory input/output, so the term I/O used in connection with intra-core I/O functionality and circuitry (e.g., such as on-chip memory I/O) would be understood as not referring to I/O transistors and circuitry used for interfacing core circuitry with off-chip circuits or components.

In some embodiments, $V_{DDH}$ circuitry 13 may comprise I/O circuitry and/or other non-core (and non-I/O) circuitry operating at so-called rail voltages of $V_{DDH}$ and $V_{SS}$. In some embodiments, $V_{DDH}$ circuitry 13 may comprise core circuitry with the $V_{DDH}$ voltage level being the nominal voltage for high performance operation of the core transistors and circuitry (e.g., at or near lowest latency, optimal performance), and with the lower $V_{DDL}$ rail voltage supplied to $V_{DDL}$ core logic circuitry 5 to reduce power dissipation while being suitable for lower performance (e.g., lower speed) operation of core circuitry. For instance, such $V_{DDL}$ core logic circuitry 5 may comprise non-critical circuitry, such as circuitry that includes neither critical signal paths nor functional blocks or cells requiring the $V_{DDH}$ voltage level to attain the necessary and/or desired high speed operation. In other words, some embodiments may be directed to employing multi-supply voltage domain technology to partition core circuitry into different voltage supply domains to facilitate reduced and/or low power dissipation (e.g., compared to using a single voltage level for all core circuitry on the chip). In some such embodiments, I/O circuitry may be implemented at $V_{DDH}$ but at higher power (i.e., higher current drive), or alternatively at yet a further supply voltage greater than $V_{DDH}$.

In other words, this illustrative embodiment of voltage-level shifter 10 is schematically depicted as being implemented as a level-up converter between core circuitry and any of I/O circuitry, other core circuitry, and other non-I/O circuitry (e.g., which may not comprise core circuitry). Those skilled in the art will also understand that while FIG. 2 schematically depicts a single instance of a voltage-level shifter 10 on an integrated circuit, an integrated circuit typically may comprise numerous instances of such a voltage-level shifter 10.

Referring again to FIG. 2, the depicted illustrative embodiment of primary voltage-level shifter 12 comprises (i) a pull-up network comprising PMOS transistors MP0, MP1, MD0, and MD1 configured as a cross-coupled transistor network 14, and (ii) a pull-down network comprising NMOS transistors MN0 and MN1. As shown, MP0, MD0, and MN0 are connected in series, with the source of MP0 connected to a conductor (e.g., a so-called rail) that is supplied at voltage $V_{DDH}$, while the drain of MP0 is connected to the source of MD0, which in turn has its drain connected to the drain of pull-down transistor MN0, which has its source connected to a conductor (rail) that is supplied at voltage $V_{SS}$. Likewise, MP1, MD1, and MN1 are connected in series, with the source of MP1 connected to the rail supplied at voltage $V_{DDH}$, while the drain of MP1 is connected to the source of MD1, which in turn has its drain connected to the drain of pull-down transistor MN0, which has its source connected to a conductor (rail) that is supplied at voltage $V_{SS}$.

In this illustrative embodiment, both the gate of transistor MN0 and the gate of transistor MN1 are directly connected to respective complementary signals from core logic circuitry 5, which is depicted as comprising inverter 7 and inverter 9 connected in series, with inverter 9 providing an output logic signal (corresponding to the signal at input node N5 of inverter 7) to input node $V_{IN}$, and with the output of inverter 7 connected to the input of inverter 9 and to the gate of transistor MN1. As such, in this illustrative embodiment, inverters 7 and 9 are not components of voltage level shifter circuit 10, but rather are components of core logic circuitry 5.

Each of PMOS transistors MD0 and MD1 has its drain connected to its gate and to the gate of PMOS transistors MP1 and MP0, respectively. As known by those skilled in the art, the gate-to-drain connection in each of PMOS transistors MD0 and MD1 configures each of these transistors as a diode-connected PMOS transistor. As also known by those skilled in the art, such a diode-connected transistor is in saturation when operational (i.e., when ON due to the gate-to-source voltage being approximately at or below the gate-to-source threshold voltage), exhibiting a drain current that is a quadratic function of the difference between the drain-to-source voltage (equivalent to gate-to-source voltage) and the threshold voltage. In other words, upon conducting current, each diode-connected transistor MD0 and MD1 will have a source-to-drain voltage drop of at least about the magnitude of its threshold voltage.

The source and drain of diode-connected PMOS transistor MD1 are connected to respective inputs of output buffer 16, which in this illustrative embodiment comprises a split-input inverter 18 coupled to a single-input inverter 20. More specifically, split-input inverter 18 includes series-connected pull-up PMOS transistor MP2 and pull-down NMOS transistor MN2 having their respective source terminals connected to conductors coupled to $V_{DDH}$ and $V_{SS}$, respectively, and their respective gate terminals conductively coupled to the respective drains of pull-up transistor MP1 and pull-down transistor MN1.

The output of split-input inverter 18 at node N2 is conductively coupled to the input of single-input inverter 20. More specifically, single-input inverter 20 includes series-connected pull-up PMOS transistor MP3 and pull-down NMOS transistor MN3 having their respective source terminals connected to conductors coupled to $V_{DDH}$ and $V_{SS}$, respectively, and their respective gate terminals conductively coupled to each other and to the drains of pull-up transistor MP2 and pull-down transistor MN2. The output $V_{OUT}$ of single-input inverter 20, which is the output of the voltage-level shifter circuit 10, is input to $V_{DDH}$ circuitry 13.

In some embodiments, such as that of FIG. 2, all transistors of primary voltage-level shifter 12, and optionally also all transistors of output buffer 16, may be implemented as core transistors. And depending on, for example, the relative current-voltage characteristics of the p-channel and n-channel transistors for the given technology node and process, each such core transistor of primary voltage-level shifter 12, and optionally also all transistors of output buffer 16, may be of minimum dimension (e.g., minimum gate width) for the technology node, in accordance with some embodiments. In addition, in some embodiments, such as that of FIG. 2, no additional transistors are connected to primary voltage shifter 12 other than as indicated (e.g., other than transistors of core logic circuitry 5 that provide a signal to $V_{IN}$, and the output buffer 16 transistors that are connected to $V_{OUT}$).

Operation of voltage-level shifter circuit 10, and particularly operation of primary voltage-level shifter 12, according to the illustrative embodiment of FIG. 2 may be understood as follows, wherein for this illustrative embodiment all transistors are enhancement mode, all n-channel transistors have the same nominal threshold voltage $V_{TN}$, all p-channel transistors have the same nominal threshold voltage $V_{TP}$ ($V_{TP}$<0), $V_{DDL}$ is greater than $V_{TN}$, and ($V_{DDH}$-|$V_{TP}$|) is greater than $V_{TN}$. Those skilled in the art will understand that in describing certain aspects of circuit operation, for ease of discussion and convenience, transistors may be described in idealized or near-idealized manner such that, for example, subthreshold current or weak inversion may be ignored (e.g., the drain current is considered zero when the transistor is in the "off" state). In view of the present disclosure, however, those skilled in the art will understand that in some implementations, non-ideal characteristics (e.g., subthreshold current as a function of gate-source voltage and drain-source voltage) should be considered for fully understanding operation of the circuit and/or for advantageously implementing a voltage level shifter according to some embodiments.

Assuming positive logic and arbitrarily assuming an initial state (during operation) in which the input $V_{IN}$ to the gate of transistor MN0 is low (i.e., MN0 is off; e.g., $V_{IN}$=$V_{SS}$) and the complementary input to the gate of transistor MN1 is high (i.e., MN1 is on, with a voltage of, e.g., $V_{DDL}$ input to its gate), then in this state the voltage at node NL1 is pulled down to $V_{SS}$ by MN1, so that transistor MP0 is on and node NL0 is pulled up to a nominal voltage in the inclusive range of ($V_{DDH}$-|$V_{TP}$|) to $V_{DDH}$, as the drain current through MP0 and MD0 is nominally zero so the drain-to-source voltage ($V_{DS}$) drop across MP0 is nominally zero and the source-to-drain voltage ($V_{SD}$) drop across MD0 is nominally in the inclusive range of |$V_{TP}$| to zero. MP1 is thus nominally off (VSG is nominally in the inclusive range of |$V_{TP}$| to zero) and the voltage at node NH1 is nominally in the inclusive range of ($V_{SS}$+|$V_{TP}$|) to $V_{SS}$, as the drain current through MN1 and MD1 is nominally zero so the drain-to-source voltage ($V_{DS}$) drop across MN1 (which is on) is nominally zero and the source-to-drain voltage ($V_{SD}$) drop across MD1 is nominally in the inclusive range of |$V_{TP}$| to zero.

In this state, with indicated nominal voltages at nodes NH1 and NL1, transistors MP2 and MN2 are on and off, respectively, so that node N2 is pulled up to voltage $V_{DDH}$. Thus, transistors MP3 and MN3 are off and on, respectively, so that $V_{OUT}$ is pulled down to $V_{SS}$. In other words, $V_{OUT}$ is low, the same logic level as $V_{IN}$.

For a low-to-high $V_{IN}$ transition from this initial state, as $V_{IN}$ transitions from $V_{SS}$ to $V_{DDL}$, as MN0 begins conducting current (sinking current from node NL0) such that diode-connected transistor MD0 begins conducting concomitant current, the voltage drop across diode-connected transistor MD0 increases above |$V_{TP}$|, thus turning on transistor MP1, thereby pulling up the node NH1 voltage and concomitantly pulling up the node NL1 voltage as transistor MN1 turns off as its gate voltage transitions from $V_{DDL}$ to $V_{SS}$ in complement to $V_{IN}$. As node NL1 is pulled up to a nominal voltage in the inclusive range of ($V_{DDH}$-|$V_{TP}$|) to $V_{DDH}$, transistor MP0 is turned off, eliminating any pull-up contention, as node NL0 is pulled down to $V_{SS}$ and node NH0 to a nominal voltage in the inclusive range of $V_{SS}$ to ($V_{SS}$+|$V_{TP}$|), as the state of the pull-up network (latch) 14 switches (e.g., toggles or inverts) from the above-assumed initial state to its other state.

In accordance with the foregoing operation of the primary voltage level shifter 12 during such low-to-high $V_{IN}$ transition, it will be understood that as nodes NH1 and NL1 are respectively pulled up to the indicated voltages, transistors MP2 and MN2 are turned off and on, respectively, thus pulling down node N2 to $V_{SS}$. Thus, transistors MP3 and MN3 are turned on and off, respectively, so that $V_{OUT}$ is pulled up to voltage $V_{DDH}$. In other words, $V_{OUT}$ transitions from low to high logic level, following the same logic level transition as $V_{IN}$.

Based on the foregoing operational description of a low-to-high Vin transition, the operation of voltage level shifter 10 under a high-to-low $V_{IN}$ transition may be readily understood as follows. As $V_{IN}$ transitions from $V_{DDL}$ to $V_{SS}$ and the complementary gate input signal of MN1 transitions from low-to-high (i.e., from $V_{SS}$ to $V_{DDL}$), as MN1 begins conducting current (sinking current from node NL1) such that diode-connected transistor MD1 begins conducting concomitant current, the voltage drop across diode-connected transistor MD1 increases above |$V_{TP}$|, thus turning on transistor MP0, thereby pulling up the node NH0 voltage and concomitantly pulling up the node NL0 voltage as transistor MN0 turns off as its gate voltage transitions from $V_{DDL}$ to $V_{SS}$. As node NL0 is pulled up to a nominal voltage in the inclusive range of ($V_{DDH}$-|$V_{TP}$|) to $V_{DDH}$, transistor MP1 is turned off, eliminating any pull-up contention at node NL1, as node NL1 is pulled down to $V_{SS}$ and node NH1 to a nominal voltage in the inclusive range of $(V_{SS}+|V_{TP}|)$ to $V_{SS}$, as the state of the cross-coupled pull-up network (latch) 14 switches (e.g., toggles or inverts) from the above-referenced other state to the above-assumed initial state. Accordingly, it will be understood that during such a high-to-low Vin transition, as nodes NL1 and NH1 are pulled down to the indicated voltages, transistors MN2 and MP2 are turned off and on, respectively, thus pulling up N2 to $V_{DDH}$. Thus, transistors MP3 and MN3 are turned off and on, respectively, so that $V_{OUT}$ is pulled down to voltage $V_{SS}$. In other words, $V_{OUT}$ transitions from high to low logic level, following the same logic level transition as $V_{IN}$.

In view of the foregoing description of an illustrative embodiment of a voltage level shifter 10, it will be understood by those skilled in the art that configuring the cross-coupled pull-up network 14 of the primary voltage level shifter 12 to include diode-connected transistors MD0 and MD1 mitigates or effectively eliminates contention between the pull-up network 14 and the pull-down network (comprising transistors MN0 and MN1), such as compared to the conventional level shifter of FIG. 1. For instance, as described, in accordance with some embodiments, a voltage drop across MD0 (MD1) sufficient to turn off pull-up transistor MP1 (MP0) can be developed at a very low current through pull-down transistor MN0 (MN1) as the gate voltage of MN0 (MN1) increases from $V_{SS}$ to $V_{DDL}$. In other words, in accordance with some embodiments, the load characteristic of diode-connected transistor MD0 (MD1) causes the cross-coupled latch network 14 to initiate and effect a state change at a low current as $V_{IN}$ transitions from $V_{SS}$ to $V_{DDL}$ ($V_{DDL}$ to $V_{SS}$) such that pull-down NMOS transistor NM0 (NM1) need not be oversized (e.g., compared to the size that would be used for implementing a high speed inverter in core logic) for sinking sufficient current to overcome pull-up contention. The capability to effect state change at low current levels (e.g., such that the pull-down transistors need not be oversized) due to the operation of the diode-connected transistors concomitantly renders voltage level shifter 10 well-suited for shifting low or very low $V_{DDL}$ levels.

For example, in various alternative embodiments, for a given technology node (e.g., of a commercial foundry process), such a drain-to-source current level through pull-down transistor MN0 (MN1) at which sufficient voltage develops across diode-connected transistor MD0 (MD1) so as to turn off pull-up transistor MP1 (MP0) may be the drain-to-source current of an n-channel core transistor of minimum dimension when the gate-to-source voltage of MN0 (MN1) is nominally equal to or greater than but near (e.g., within about 300 mV) the threshold voltage $V_{TN}$ (e.g., referred to as "near-threshold" voltage, and the corresponding current as near-threshold current), or, alternatively, is less than the threshold voltage $V_{TN}$ (e.g., referred to as "sub-threshold" voltage, and the corresponding current as sub-threshold current).

As described, in some embodiments such as that depicted in FIG. 2, primary voltage-level shifter 12 may be configured for coupling to $V_{DDL}$ core logic circuitry 5 that is appropriately configured to provide both an input logic signal at node $V_{IN}$ to the gate of MN0 and a complement of the input logic signal to the gate of MN1. As such, primary voltage-level shifter 12 need not itself comprise an inverter configured to receive a logic signal from $V_{DDL}$ core logic circuitry 5 and generate a complementary logic signal, such that an input logic signal and its complement are input to MN0 and MN1, respectively.

Figure 3:
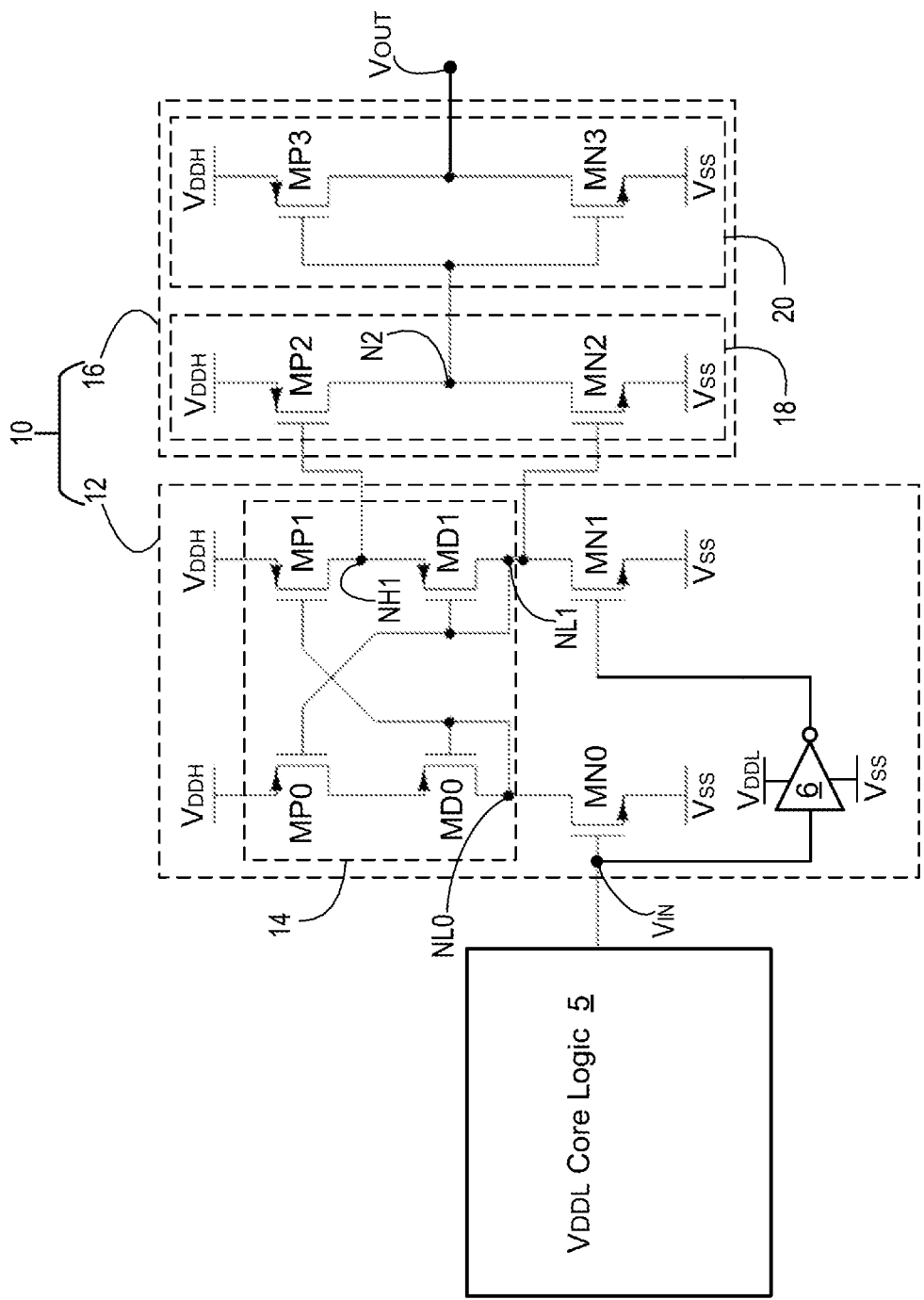
FIGS. 3, 4, 5, 6A, and 6B schematically depict alternative embodiments of the illustrative voltage-level shifter circuit of FIG. 2, in accordance with some embodiments.
Figure 4:
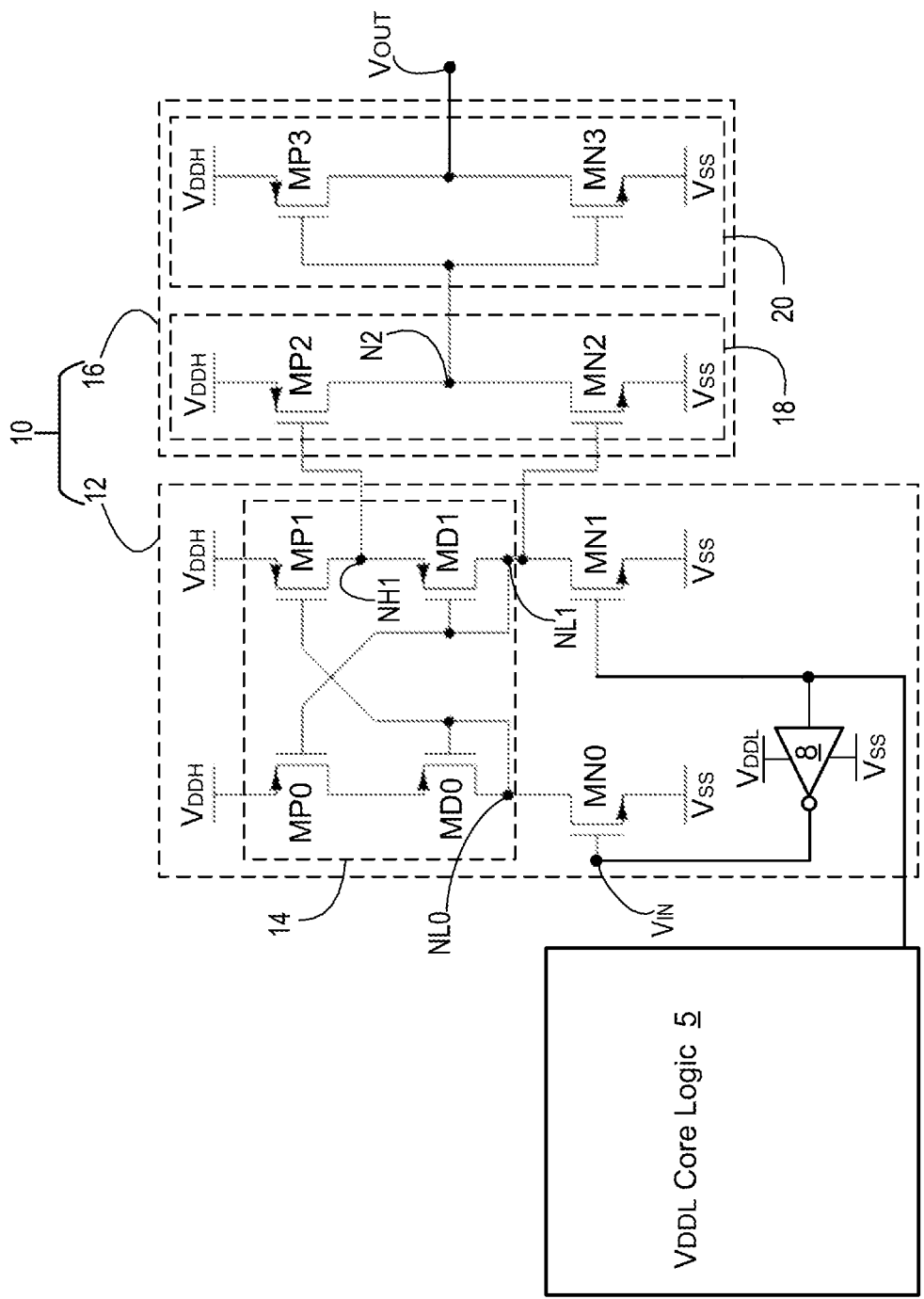

In various alternative embodiments, however, such as depicted in FIGS. 3 and 4, primary voltage-level shifter 12 may comprise such an inverter 8 (thus requiring an additional two transistors). In FIG. 3, $V_{DDL}$ core logic circuitry 5 outputs a logic signal to be level-shifted, and this output of $V_{DDL}$ core logic circuitry 5 is connected to both the inverter 8 input and node $V_{IN}$, and the inverter 8 output is connected to the gate of MN1. In FIG. 4, $V_{DDL}$ core logic circuitry 5 outputs the complement of a logic signal to be level-shifted, and this output of $V_{DDL}$ core logic circuitry 5 is connected to both the inverter 8 input and the gate of MN1, and the inverter 8 output is connected to node $V_{IN}$.

Figure 5:
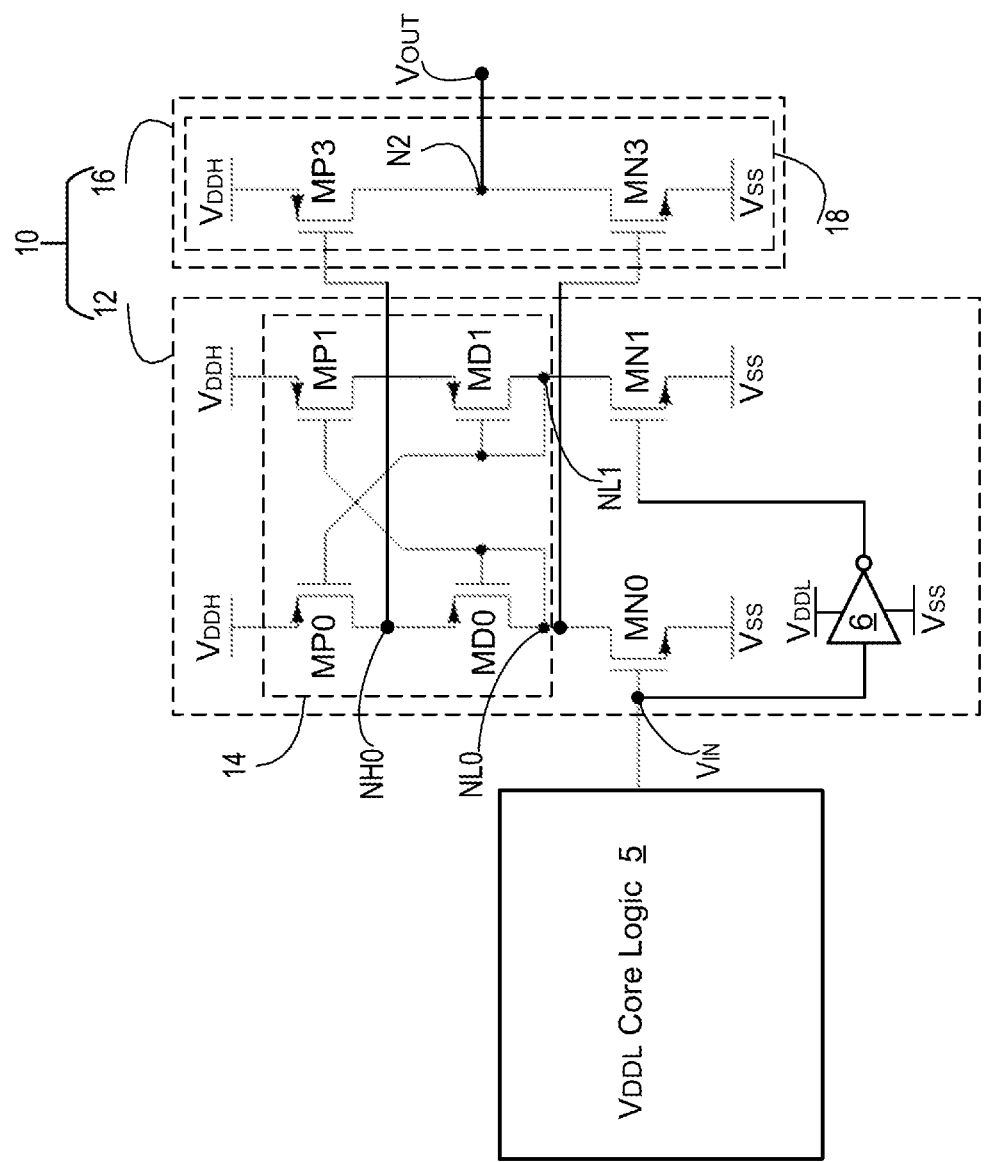

Various alternative embodiments may employ different configurations of output buffer circuit 16, including various alternative dual-stage configurations as well as single-stage configurations. For instance, FIG. 5 schematically depicts a voltage level converter circuit comprising voltage converter stage 12 configured with a single-stage split-input inverter 18 that provides the level-shifted output $V_{OUT}$, in accordance with some embodiments. As shown, the respective gates of pull-up PMOS transistor MP3 and pull-down NMOS transistor MN3 of split-input inverter 18 are conductively coupled to nodes NH0 and NL0, respectively.

Figure 6A:
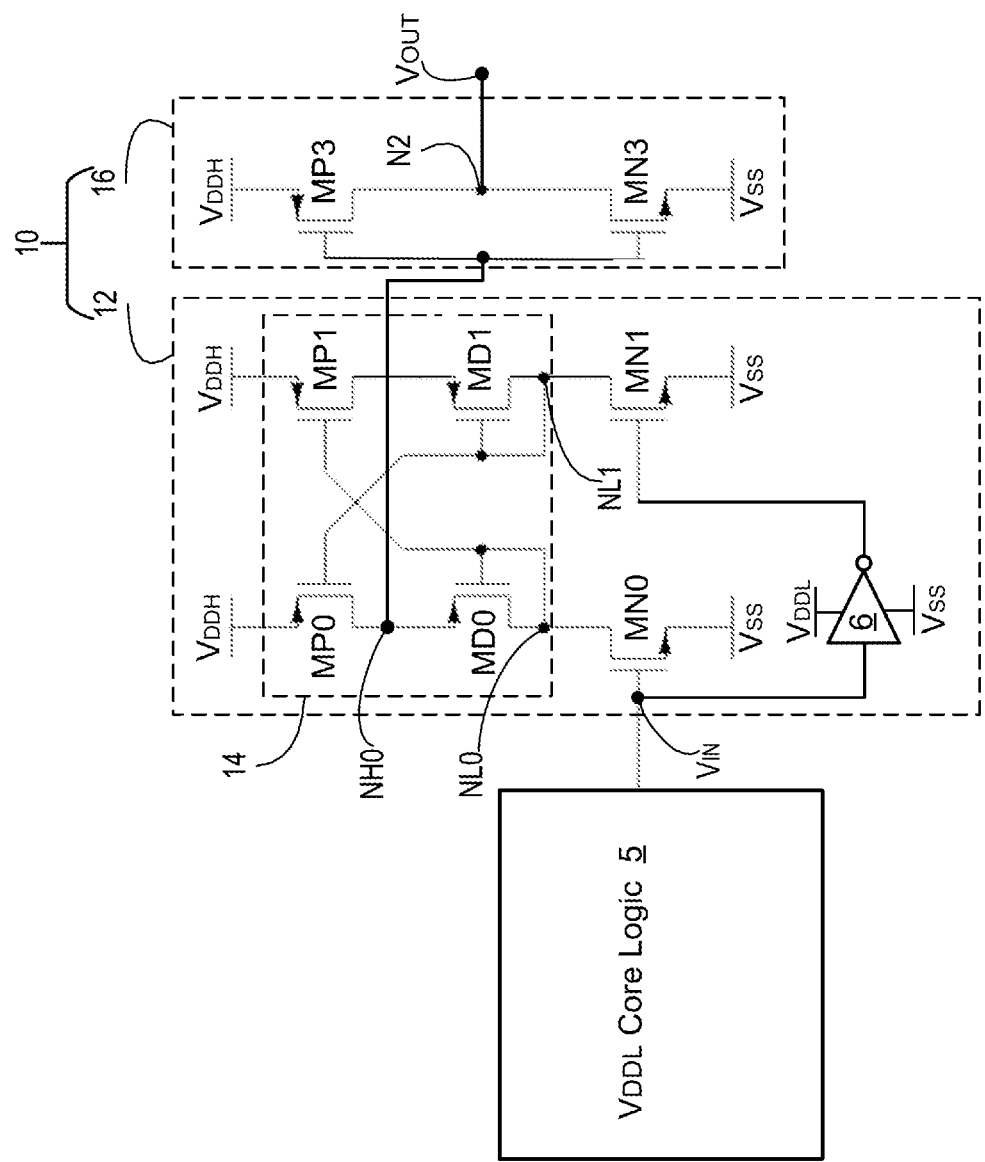
Figure 6B:
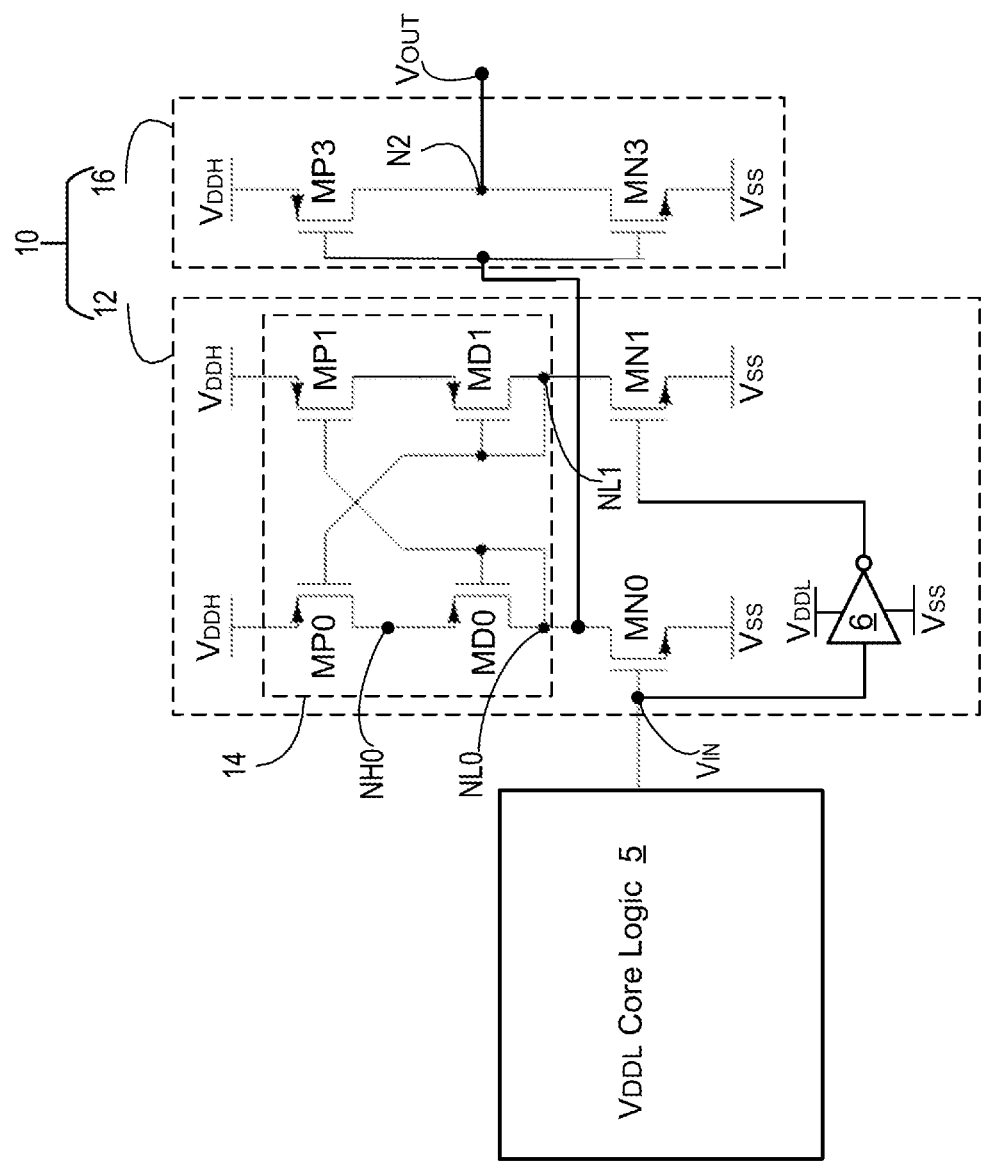

Also by way of example, FIGS. 6A and 6B schematically depict alternative embodiments of a voltage-level converter circuit comprising voltage converter stage 12 configured with a single-stage single-input inverter 16 that provides the level-shifted output $V_{OUT}$. As shown, the gates of pull-up PMOS transistor MP3 and pull-down NMOS transistor MN3 of single-input inverter 16 are conductively coupled to node NH0 in FIG. 6A and to node NL0 in FIG. 6B.

Figure 7:
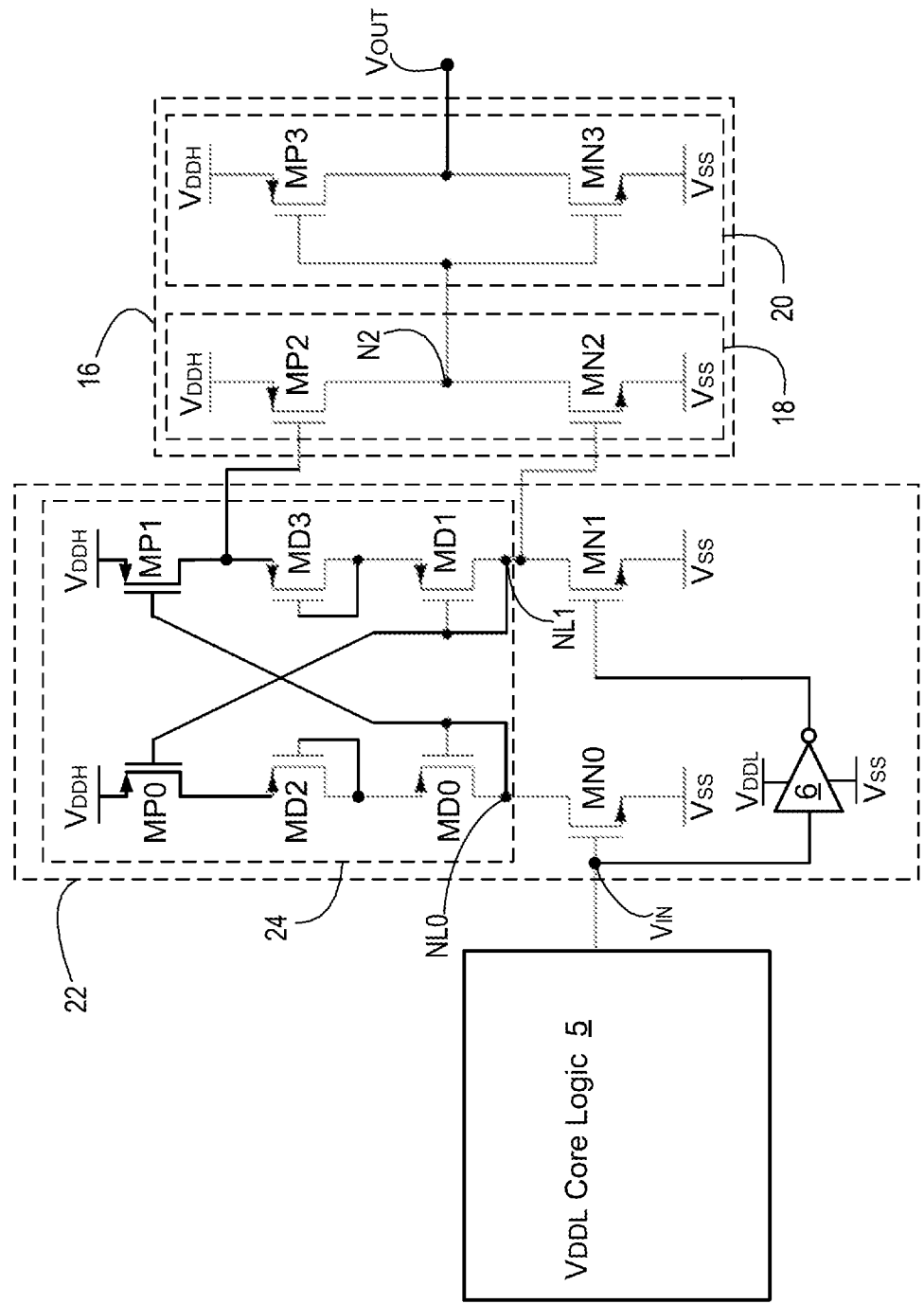
FIG. 7 schematically depicts an illustrative voltage-level shifter circuit incorporating additional diode-connected transistors, in accordance with some embodiments.

FIG. 7 schematically depicts an alternative embodiment in which each branch of the cross-coupled pull-up network includes two series-connected diode-connected transistors. More specifically, one branch comprises diode-connected PMOS transistors MD0 and MD2 connected in series with each other and with pull-up transistor MP0, while the other branch comprises diode-connected PMOS transistors MD1 and MD3 connected in series with each other and with pull-up transistor MP0. Compared to the embodiment of FIG. 2, for example, the additional diode-connected transistor in each branch of the pull-up network provides additional voltage drop to further facilitate initiating and effecting turn-on of the pull-up PMOS transistor in the opposing branch of the pull-up network at low current (and concomitantly, low voltage at $V_{IN}$) as the pull-down transistor of the same branch turns on. It will be understood that various alternative embodiments may employ more than two series-connected diode-connected transistors in each branch of the pull-up network.

Figure 8:
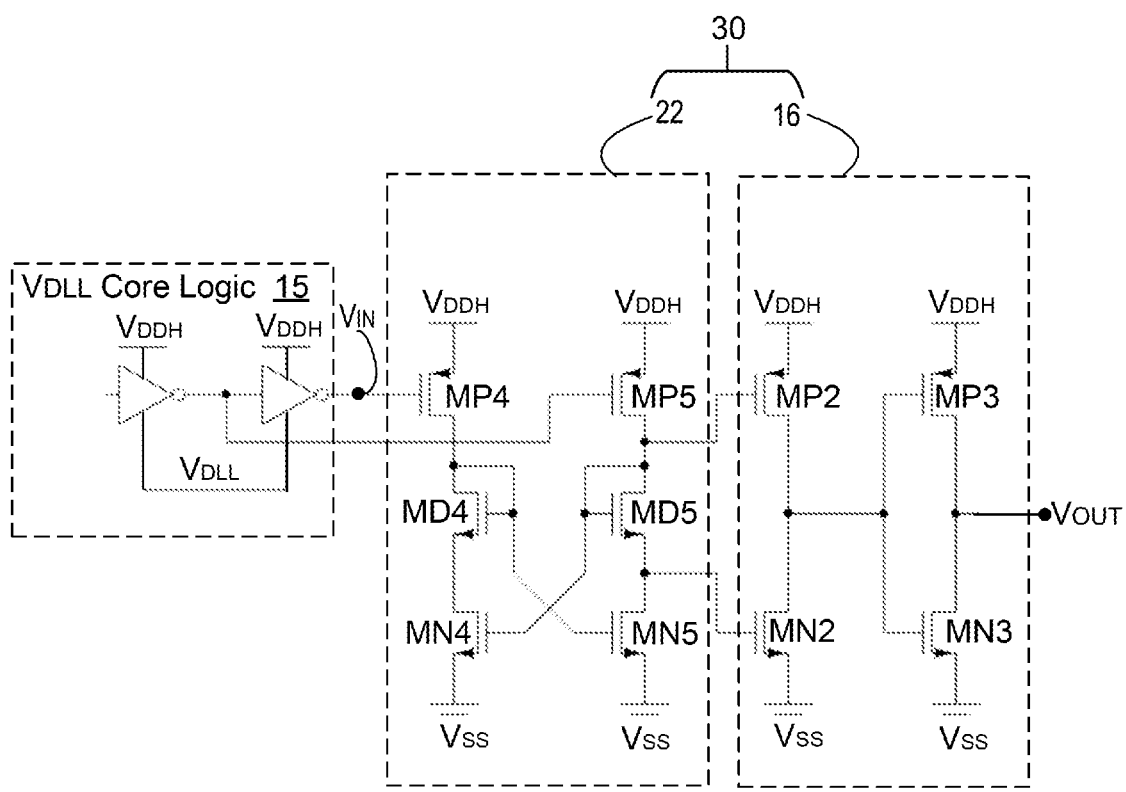
FIG. 8 schematically depicts an illustrative voltage-level shifter circuit corresponding to a complementary implementation of the illustrative voltage-level shifter circuit of FIG. 2, in accordance with some embodiments.

FIG. 8 schematically depicts an illustrative alternative embodiment of a voltage level-shifter 30 corresponding to the complementary circuit of the embodiment of FIG. 2. As shown, voltage level shifter circuit 30 comprises a primary voltage level shifter 22 and output buffer 16 being supplied by a first supply voltage $V_{DDH}$ and a second supply voltage $V_{SS}$ (indicated as being at ground potential) where $V_{DDH}$ is greater than $V_{SS}$. $V_{DLL}$ core logic circuitry 15 is supplied by the first supply voltage $V_{DDH}$ and by a third supply voltage $V_{DLL}$, wherein voltage $V_{DDH}$ is greater than voltage $V_{DLL}$, which is greater than voltage $V_{SS}$ (i.e., $V_{DDH}>V_{DLL}>V_{SS}$).

Primary voltage-level shifter 22 comprises (i) a pull-down network comprising NMOS transistors MN4, MN5, MD4, and MD5 configured as a cross-coupled transistor network, and (ii) a pull-up network comprising PMOS transistors MP4 and MP5. MD4 and MD5 are configured as diode-connected NMOS transistors. Briefly, in operation voltage level shifter circuit 30 (i) receives at input node $V_{IN}$ from $V_{DLL}$ core logic circuitry 15 an input logic signal having a voltage swing between voltage $V_{DDH}$ and voltage $V_{DLL}$ and (ii) outputs at output node $V_{OUT}$ an output logic signal logically equivalent to the input logic signal and having a voltage swing between voltage $V_{DDH}$ and voltage $V_{SS}$. More specifically, the logic level represented by voltage $V_{DLL}$ for the input logic signal is represented by voltage $V_{SS}$ for the output logic signal, while the logic level represented by voltage $V_{DDH}$ for the input logic signal is also represented by voltage $V_{DDH}$ for the output logic signal. In view of the foregoing detailed disclosure of the operation of the illustrative embodiment of FIG. 2, operation of voltage level shifter 30, including the operation effect of including the diode-connected transistors MD4 and MD5, may be readily understood and therefore is not described in detail.

In some embodiments, voltage level shifters (such as level shifters 10 and 30) may be designed with each of the PMOS transistors specified as having the same PMOS threshold voltage and each of the NMOS transistors as having the same NMOS threshold voltage. As will be understood by those skilled in the art, however, upon fabrication of such voltage level shifter 10 and 30, the actual threshold voltages of the PMOS transistors will vary somewhat as will the actual threshold voltage of the NMOS transistors (e.g., due to process-related and/or geometry-related variations), so that the PMOS transistors may be said to have substantially the same PMOS threshold voltage and, likewise, the NMOS transistors may be said to have substantially the same NMOS threshold voltage. In some embodiments, however, a voltage level shifter (such as level shifter 10 or 30) may be designed according to multi-threshold voltage design to further optimize, e.g., power dissipation, timing, and operation. For instance, various commercial CMOS technology nodes provide for transistors (e.g., FinFETs) of each type (i.e., PMOS and NMOS) within the same chip to be selectively designed to have any of at least two different threshold voltages (e.g., normal, high, and low threshold voltages).

Embodiments in accordance with the present disclosure, such as the hereinabove described illustrative embodiments, are not limited to a particular FET technology or CMOS process or technology node. By way of non-limiting example, FETs may be implemented as planar FETs, FinFETs, or gate-all-around (GAA) FETs, and technology nodes may include commercial foundry. As may be appreciated, however, embodiments in accordance with the present disclosure are particularly well-suited for overcoming pull-up versus pull-down contention limitations.

Accordingly, in view of the foregoing disclosure, it may be understood that by incorporating diode-connected transistors into the cross-coupled latch network so as to cause the state of the cross-coupled latch to be switched at a low current (e.g., at a subthreshold or near-threshold current), the current contention problem is mitigated or averted in a way that does not require transistor over-sizing, thus allowing the level shifter to be implemented with core transistors, and concomitantly providing for low propagation delay, low power dissipation, and reduced chip real estate requirements (e.g., compared to at least the known level-shifter of FIG. 1).

By way of non-limiting example and simply for purposes of illustration, various simulations of a level shifter 10 in accordance with some embodiments, have demonstrated very low-propagation delay, very low power dissipation level-shifting of input signals ranging from 0.23 V to 0.35 V, over $V_{DDH}$ ranging from 0.6 V to 0.85 V, with $V_{SS}$ set as ground potential (i.e, zero volts), an NMOS threshold voltage of 0.18 V, and a PMOS threshold voltage of −0.18 V.

It may be further appreciated that by dropping a portion of the rail-to-rail voltage, the diode-connected transistors also reduce the voltage drop—and hence stress—on the pull-up the pull-down transistors, which further facilitates or enables implementing the transistors as core transistors, which typically are specified with (and can sustain) lower maximum drain-to-source voltage than, for example, I/O transistors.

It may be further understood that a primary voltage level shifter 12 in accordance with some embodiments, such as that illustrated in FIG. 2, requires no more than six transistors, and each transistor may be implemented as a core transistor. Likewise, in accordance with some embodiments, such as those illustrated in FIGS. 6A and 6B, wherein primary voltage level shifter 12 may also comprise an inverter coupled between the gates of pull-down transistors MN0 and MN1, primary voltage level shifter 12 requires no more than eight transistors. As such, voltage level shifters in accordance with embodiments of the present disclosure occupy a small region of chip real estate.

In view of the present disclosure, those skilled in the art will further understand that various alternative embodiments are not limited to incorporating into the latch network diode-connected FETs of the same conductivity type as the pull-up (or pull-down) latch transistors to which they are coupled. For instance, various alternative embodiments may be provided by substituting diode-connected NMOS transistors for diode-connected PMOS transistors MD0, MD1, MD2, MD3 in the foregoing embodiments of FIGS. 2-5, 6A, 6B and 7. Likewise, an illustrative alternative embodiment may be provided by substituting diode-connected PMOS transistors for diode-connected NMOS transistors MD4 and MD5 in the embodiment of FIG. 8. Likewise, those skilled in the art will understand in view of the foregoing disclosure that various alternative embodiments are not limited to diode-connected insulating gate FETs being incorporated into the latch network, and may alternatively or additionally employ any appropriate rectifying device, such as a diode-connected junction field effect transistor (JFET), a two-terminal p-n junction diode, and/or a metal-semiconductor junction (e.g., Schottky diode).

Although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, the structure and/or function of a component may be combined into a single component or divided among two or more components. In addition, it is specifically contemplated that a particular feature described, either individually or as part of an embodiment, can be combined with other individually described features, or parts of other embodiments. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with claims that are based on the present disclosure, as such claims may be presented herein and/or in any patent applications claiming priority to, based on, and/or corresponding to the present disclosure.

What is claimed is:

1. A voltage level shifter circuit, comprising:
   a cross-coupled transistor network comprising (i) a first field-effect transistor (FET) of a first conductivity type having a source coupled to a first supply conductor that is configured to be electrically connected to a first supply voltage, (ii) a first plurality of series-connected diode-connected FETs of the first conductivity type, including a first diode-connected FET having a source electrically connected to a drain of the first FET, and a third diode-connected FET (iii) a second FET of the first conductivity type having a source coupled to the first supply conductor and having a gate coupled to the gate and drain of the third diode-connected FET, and (iv) a second plurality of series-connected diode-connected FETs of the first conductivity type, including a second diode-connected FET having a source electrically connected to a drain of the second FET, and a fourth diode-connected FET having a gate and a drain coupled to a gate of the first FET;
   a first input FET of a second conductivity type opposite to the first conductivity type, the first input FET having a source coupled to a second supply conductor that is configured to be electrically connected to a second supply voltage, a drain coupled to the drain of the third diode-connected FET, and a gate configured to receive an input logic signal having an input voltage swing that ranges from the second supply voltage to a third supply voltage that is between the second supply voltage and the first supply voltage;
   a second input FET of the second conductivity type, the second input FET having a source coupled to the second supply conductor, a drain coupled to the drain of the fourth diode-connected FET, and a gate configured to receive a second input logic signal having said input voltage swing and being complementary to the first input logic signal; and
   an output buffer transistor circuit coupled to the first supply conductor, to the second supply conductor, and to at least one node of the cross-coupled transistor network, and configured to provide an output logic signal corresponding to the input logic signal and having an output voltage swing that ranges from the second supply voltage to the first supply voltage.

2. The voltage level shifter circuit according to claim 1, wherein the cross-coupled transistor network includes no more than six transistors consisting of said first and second FETs and said first, second, third, and fourth diode-connected FETs, and is not directly coupled to any additional transistors except for the first and second input FETs and one or more transistors of the output buffer transistor circuit.

3. The voltage-level shifter circuit according to claim 2, wherein each of said first and second input FETs is not directly coupled to any additional transistors except for (i) the drains of said first and second input FETs being directly coupled respectively to the third and fourth diode-connected FETS, and (ii) the gates of the first and second input FETs being directly coupled to one or more transistors of an inverter that is coupled to the second supply conductor and to a third supply conductor that is configured to be electrically connected to the third supply voltage, such that the first input logic signal is one of an input signal and an output signal of the inverter and the second input logic signal is the other of the input signal and the output signal of the inverter.

4. The voltage level shifter circuit according to claim 3, wherein the voltage level shifter circuit comprises said inverter.

5. The voltage level shifter circuit according to claim 1, wherein the first input logic signal is one of an input signal and an output signal of an inverter, and the second input logic signal is the other of the input signal and the output signal of the inverter, wherein the inverter comprises a plurality of FETs and is coupled to the second supply conductor and to a third supply conductor that is configured to be electrically connected to the third supply voltage.

6. The voltage level shifter circuit according to claim 5, wherein the voltage level shifter circuit comprises said inverter.

7. The voltage level shifter circuit according to claim 1, wherein the output buffer transistor circuit comprises:
   a split-input inverter comprising (i) a first output buffer FET of the first conductivity type having a source coupled to the first supply conductor, a gate coupled to the drain of the second FET, and a drain, and (ii) a second output buffer FET of the second conductivity type having a drain coupled to the drain of the first output buffer FET, a source coupled to the second supply conductor, and a gate coupled to the drain of the fourth input FET; and
   a single-input output inverter comprising (i) a third output buffer FET of the first conductivity type having a source coupled to the first supply conductor, a gate coupled to the drain of the second output buffer FET, and a drain, (ii) a fourth output buffer FET of the second conductivity type having a drain coupled to the drain of the first output buffer FET, a source coupled to the second supply conductor, and a gate coupled to the gate of the third output buffer FET, and (iii) a node, coupled to the drains of the third and fourth output buffer FETs, at which the output logic signal is provided.

8. The voltage level shifter circuit according to claim 1, wherein each of the FETs of the voltage level shifter circuit, including said first and second FETS, said first, second, third, and fourth diode-connected FETs, and each transistor of the output buffer transistor circuit, are core transistors.

9. The voltage level shifter circuit according to claim 8, wherein each of the FETs of the first conductivity type are configured to have substantially the same first threshold voltage, and each of the FETs of the second conductivity type are configured to have substantially the same second threshold voltage.

10. The voltage level shifter circuit according to claim 9, wherein each of the FETs of the first conductivity type and each of the FETs of the second conductivity type has a gate having a gate length and a gate width, wherein the gate lengths of the FETs of the first and second conductivity types are configured to be substantially equal, and the gate widths of the FETs of the first and second conductivity types are configured to be substantially equal.

11. The voltage level shifter circuit according to claim 10, wherein for a given technology node at which the voltage-level shifter circuit is fabricated, the gate length is a minimum gate length for the technology node, and the gate width is a minimum gate width for the technology node.

12. The voltage level shifter according to claim 1, wherein the first conductivity type is p-type and the second conductivity type is n-type, the first and second FETs and the first, second, third, and fourth diode-connected FETs are p-channel insulated gate FETs, and the first and second input FETS are n-channel insulated gate FETs.

13. The voltage level shifter according to claim 1, wherein the first conductivity type is n-type and the second conductivity type is p-type, the first and second FETs and the first, second, third, and fourth diode-connected FETs are n-channel insulated gate FETs, and the first and second input FETS are p-channel insulated gate FETs.

* * * * *